United States Patent
Hart et al.

(10) Patent No.: US 7,545,147 B2
(45) Date of Patent: Jun. 9, 2009

(54) SYSTEM AND METHOD FOR NONDESTRUCTIVE TESTING OF THERMAL BATTERIES

(75) Inventors: Mark Hart, Carl Junction, MO (US); Travis Qualls, Riverton, KS (US); William G. Studyvin, Cherokee, KS (US)

(73) Assignee: EaglePicher Technologies, LLC, Joplin, MO (US)

( * ) Notice: Subject to any disclaimer, the term of this patent is extended or adjusted under 35 U.S.C. 154(b) by 501 days.

(21) Appl. No.: 11/162,061

(22) Filed: Aug. 26, 2005

(65) Prior Publication Data

US 2006/0043975 A1    Mar. 2, 2006

Related U.S. Application Data

(60) Provisional application No. 60/606,199, filed on Aug. 31, 2004.

(51) Int. Cl.
*G01N 27/416* (2006.01)
*H02J 7/00* (2006.01)
*H02J 7/04* (2006.01)

(52) U.S. Cl. .................. 324/431; 320/132; 320/149

(58) Field of Classification Search .......... 324/426, 324/430–434; 320/132, 149
See application file for complete search history.

(56) References Cited

U.S. PATENT DOCUMENTS

| | | | | |
|---|---|---|---|---|
| 4,810,599 A | * | 3/1989 | Kondo et al. | 429/323 |
| 5,238,761 A | * | 8/1993 | Ryan | 429/338 |
| 5,369,364 A | * | 11/1994 | Renirie et al. | 324/430 |
| 5,587,924 A | * | 12/1996 | Rossi | 702/63 |
| 5,608,306 A | * | 3/1997 | Rybeck et al. | 320/106 |
| 5,698,961 A | * | 12/1997 | Kutz et al. | 320/125 |
| 5,744,962 A | * | 4/1998 | Alber et al. | 324/426 |
| 6,114,838 A | * | 9/2000 | Brink et al. | 320/136 |
| 6,228,904 B1 | | 5/2001 | Yadav et al. | |
| 6,249,125 B1 | * | 6/2001 | Haddad et al. | 324/426 |

(Continued)

OTHER PUBLICATIONS

D. J. Sawayda and J. E. Garni; "Thermal Battery Testing"; Jul. 2003, 39th AIAA/ASME/SAE/ASEE Joint Propulsion Conference and Exhibit in Huntsville, Alabama; AIAA 2003-5141 copyright of 2003 by American Institute of Aeronautics and Astronautics, Inc.; pp. 1-11.*

(Continued)

*Primary Examiner*—Jessica Han
*Assistant Examiner*—Emily Pham
(74) *Attorney, Agent, or Firm*—Snell & Wilmer LLP

(57) ABSTRACT

The present invention generally relates to a thermal battery testing apparatus and a method for testing a thermal battery. The method includes one or more of the following steps: connecting the thermal battery in series with a resistance; connecting the thermal battery and resistance in series with a sinusoidal voltage source; applying a sinusoidal voltage to the thermal battery, measuring an impedance, reactance and/or capacitance across two terminals of the thermal battery, comparing the measured impedance, reactance and/or capacitance to a reference impedance, reactance and/or capacitance; and indicating whether the tested thermal battery is "in family" or "out of family." The battery testing apparatus may include a testing device configured to apply a sinusoidal voltage to the thermal battery and to measure the impedance, reactance and/or capacitance across two terminals of the thermal battery. The testing apparatus may further be configured to report "out of family" batteries.

25 Claims, 3 Drawing Sheets

U.S. PATENT DOCUMENTS

| | | | |
|---|---|---|---|
| 6,313,609 B1* | 11/2001 | Brink | 320/132 |
| 6,384,571 B1* | 5/2002 | Velez et al. | 320/101 |
| 6,737,463 B2 | 5/2004 | Yadav et al. | |
| 6,737,831 B2* | 5/2004 | Champlin | 320/132 |
| 6,743,876 B2 | 6/2004 | Wille et al. | |
| 6,778,913 B2* | 8/2004 | Tinnemeyer | 702/30 |
| 6,806,716 B2* | 10/2004 | Bertness et al. | 324/426 |
| 6,809,649 B1* | 10/2004 | Wendelrup et al. | 340/636.1 |
| 6,906,523 B2* | 6/2005 | Bertness et al. | 324/426 |
| 7,019,542 B2* | 3/2006 | Tinnemeyer | 324/709 |
| 7,079,038 B2* | 7/2006 | Wendelrup et al. | 340/636.1 |
| 7,190,171 B2* | 3/2007 | Kawakami et al. | 324/430 |
| 2004/0189245 A1* | 9/2004 | Teraoka et al. | 320/107 |
| 2004/0251907 A1* | 12/2004 | Kalley | 324/426 |

OTHER PUBLICATIONS

Wells et al, "Unintentional Thermal Battery Activation due to Missile Systempower Application to Battery Outputs; Cause and Corrective Actions", Jun. 22-25, 1992, IEEE Power Source Symposium, pp. 236-242.*

Buchmann, "Rapid-Testing of Large Batteries, How accurate is AC conductance?", Mar. 2003, Cadex Electronics Inc., pp. 1-4.*

* cited by examiner

SYSTEM AND METHOD FOR NONDESTRUCTIVE TESTING OF THERMAL BATTERIES

CROSS-REFERENCE TO RELATED APPLICATIONS

This application claims priority to, and the benefit of, U.S. Provisional Application No. 60/606,199, filed Aug. 31, 2004, which is incorporated herein by reference.

FIELD OF INVENTION

The present invention generally relates to thermal batteries, and more particularly, to systems, methods, and devices for facilitating testing of thermal batteries.

BACKGROUND OF INVENTION

Thermal batteries provide a large amount of energy relative to their volume. These batteries, if hermetically sealed, can be stored substantially indefinitely without degradation of performance and can perform without preliminary preparation in many different environments. Thus, thermal batteries are a desirable source of power in a number of different applications. For example, thermal batteries are used in missile systems such as JDAM, Stinger, Javelin, as well as other systems such as aircraft ejector seats, and sonar buoys.

Thermal batteries contain materials that generally are inert and non-conductive until the battery is activated. Upon activation, the materials become molten and highly conductive. This allows the cathode to interact with the anode. The thermal battery materials are activated by igniting the battery. For example, a mixture of iron powder and potassium perchlorate may be used to ignite a battery. Once activated, the battery may continue to perform until the active material is exhausted or until the battery cools below the melting point of the electrolyte.

Understandably, it is desirable to test a thermal battery in a manner that does not ignite the battery. Typically, thermal batteries are tested using an 'insulation resistance' test. This test is performed by measuring the resistance in the path from one battery terminal to another and to the battery container. Unfortunately, this test may only disclose the existence of a short circuit in the battery. It generally may not disclose the quality of the components or connections there between. For example, it may not detect a poor weld connection between components within the thermal battery. Thus, additional systems, methods, and devices are needed to facilitate non-destructive testing of thermal batteries.

SUMMARY OF INVENTION

The present invention generally relates to a thermal battery testing apparatus and a method for nondestructively testing a thermal battery. The method includes one or more of the following steps: (i) connecting the thermal battery in series with a resistance; (ii) connecting the thermal battery and resistance in series with a sinusoidal voltage source; (iii) applying a sinusoidal voltage to the thermal battery; (iv) measuring an impedance across two terminals of the thermal battery; (v) comparing the measured impedance to a reference impedance; and (vi) indicating whether the tested thermal battery is "in family" or "out of family." The battery testing apparatus may include a testing device configured to apply a sinusoidal voltage to the thermal battery and to measure the impedance across two terminals of the thermal battery. The testing apparatus further may be configured to report "out of family" batteries. The testing apparatus may perform the above measurements in terms of impedance, reactance or capacitance.

BRIEF DESCRIPTION OF THE DRAWINGS

A more complete understanding of the present invention may be derived by referring to the detailed description and claims when considered in connection with the drawing Figures, wherein like reference numbers refer to similar elements throughout the drawing Figures, and:

DETAILED DESCRIPTION

While exemplary embodiments are described herein in sufficient detail to enable those skilled in the art to practice the invention, it should be understood that other embodiments may be realized and that logical and mechanical changes may be made without departing from the spirit and scope of the invention. Thus, the following detailed description is presented for purposes of illustration only and not of limitation.

In general, systems, methods, and devices in accordance with various exemplary embodiments of the present invention are suitably configured to facilitate nondestructive testing of thermal batteries. The testing may facilitate a determination of whether the tested thermal battery is "in family" or "out of family." An "in family" battery as used herein is a thermal battery that satisfies standards and/or specifications for that type of thermal battery. Furthermore, "in family" thermal batteries of the same type will generally have similar test results when tested under the same or similar conditions using thermal battery testing apparatus such as those described herein. In contrast, an "out of family" thermal battery may have significantly different test results from an "in family" thermal battery, even when tested under the same conditions. An "out of family" thermal battery may be a thermal battery that is outside of quality control standards and/or specifications.

Testing of thermal batteries in accordance with one aspect of an exemplary embodiment may be facilitated, for example, through use of impedance measurements, reactance measurements and/or capacitance measurements. These measurements may be compared to one or more reference values, such as standard measurements, to analyze the integrity of the thermal battery. In accordance with various exemplary embodiments of the invention, various types of thermal batteries may be tested, and they may be tested in the factory, during the construction process, and/or in the field.

Figure 1:
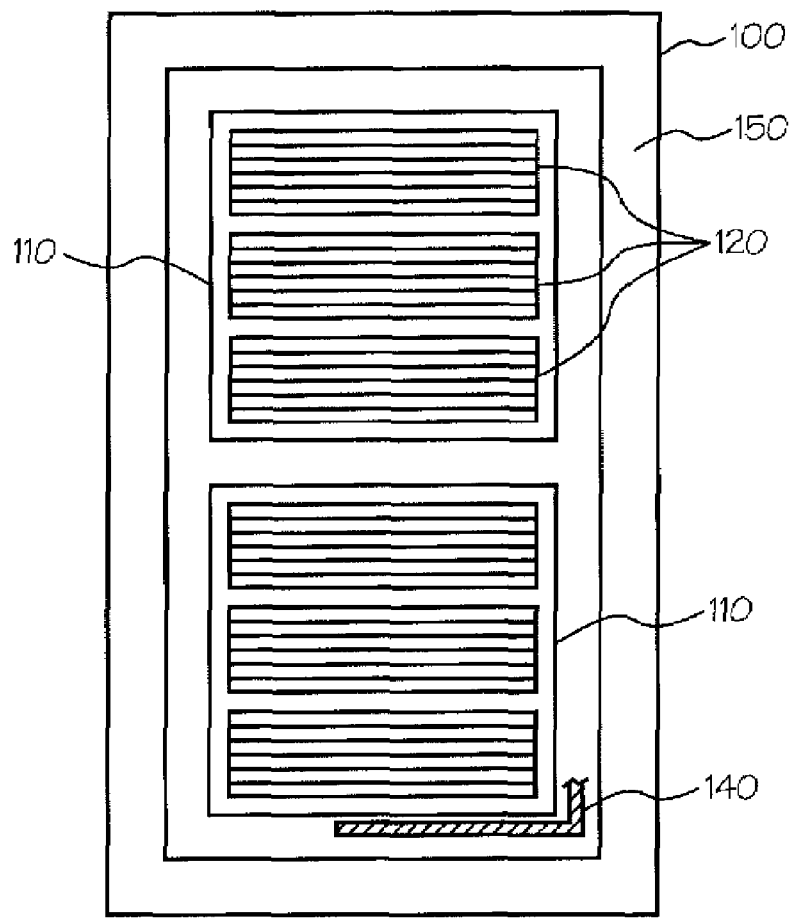
FIG. 1 illustrates a cross section of an exemplary thermal battery.

Thermal batteries are available in many sizes and shapes, have various performance factors, and are constructed of a variety of materials. Nevertheless, an exemplary thermal battery is described briefly here, with reference to FIG. 1. An exemplary thermal battery 100 comprises one or more sections 110, with each section comprising one or more cells 120, and wherein each cell comprises a plurality of pellets 130. The pellets may, for example, be thin wafers of compacted powders forming the various components of the thermal battery. For example, the pellets may comprise a stainless steel electrode, a lithium alloy anode, an electrolyte, an iron disulfide cathode, a pyrotechnic heat source, and/or the like. Typically, although not necessarily, each cell within a single battery is similar to the other cells (in terms of materials of construction, size, shape, etc.). For example, each cell may be configured to have a 2 Volt potential difference across the activated cell.

Figure 2:
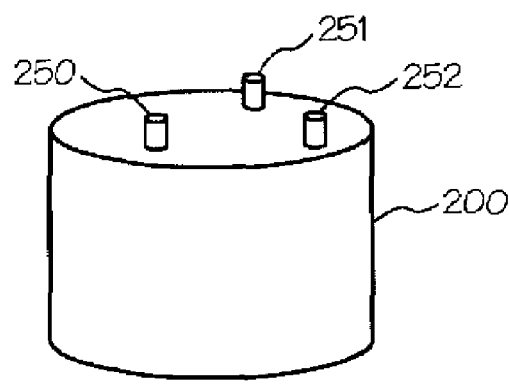
FIG. 2 illustrates an exemplary thermal battery in perspective view.

This exemplary thermal battery may further be configured with electrically conducting tabs (e.g., 140) between sections of the battery. There may be two or more tabs (e.g., 140), and each tab may be electrically connected to a terminal on the thermal battery (e.g., FIG. 2, terminals 250-252). These electrical connections may comprise welded connections, crimped connections, and/or the like. Furthermore, all or a portion of the assembly may be surrounded by insulation 150. Often, the thermal battery is packaged in a stainless steel container, such as the right circular cylinder that is illustrated in FIG. 2. The thermal battery 200 may be used, for example, by electrically connecting to two or more of the thermal battery terminals (e.g., 250-252) and igniting the battery (by electrical ignition or by mechanically firing a primer).

The above-described thermal battery is just one exemplary thermal battery device, and many variations, sizes, and configurations of thermal batteries exist. However, regardless of the configuration of the internal components, or the size and shape of the thermal battery, it is nevertheless desirable to test a thermal battery. Thermal batteries may be tested destructively, through methods including ignition of the battery. However, in accordance with one aspect of the present invention, the thermal battery is non-destructively tested. For example, a thermal battery may be tested using an impedance test. In another example, a thermal battery may be tested using a reactance test. In yet another example, a thermal battery may be tested using a capacitance test.

Figure 3:
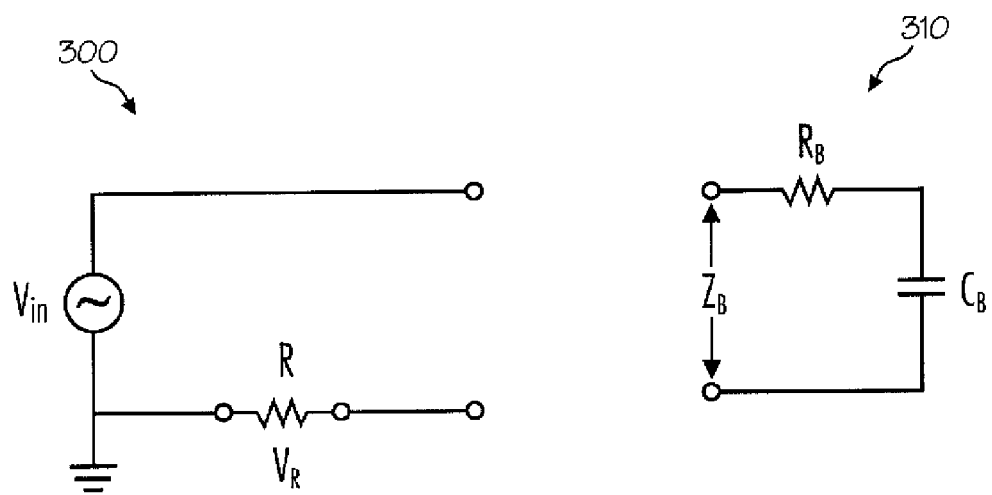
FIG. 3 illustrates a circuit of an exemplary thermal battery testing apparatus and a model thermal battery.
Figure 4:
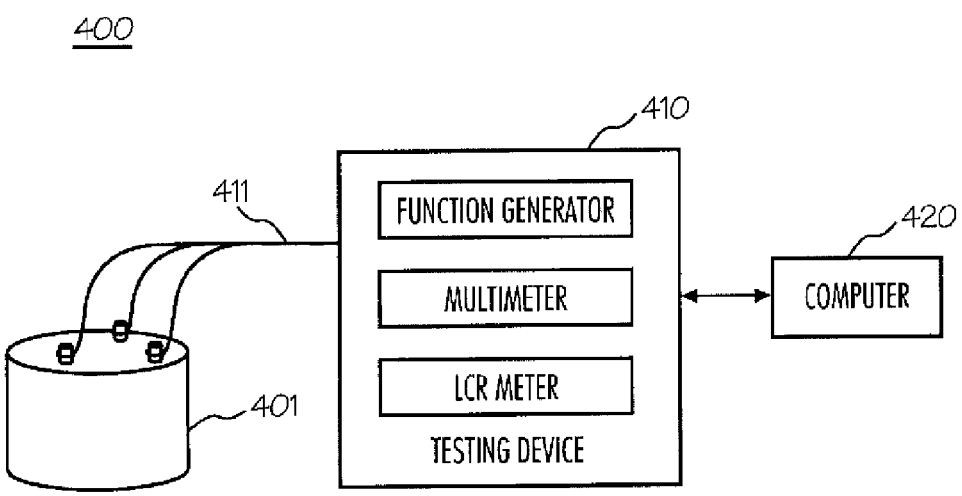
FIG. 4 illustrates an exemplary thermal battery testing system.
Figure 5:
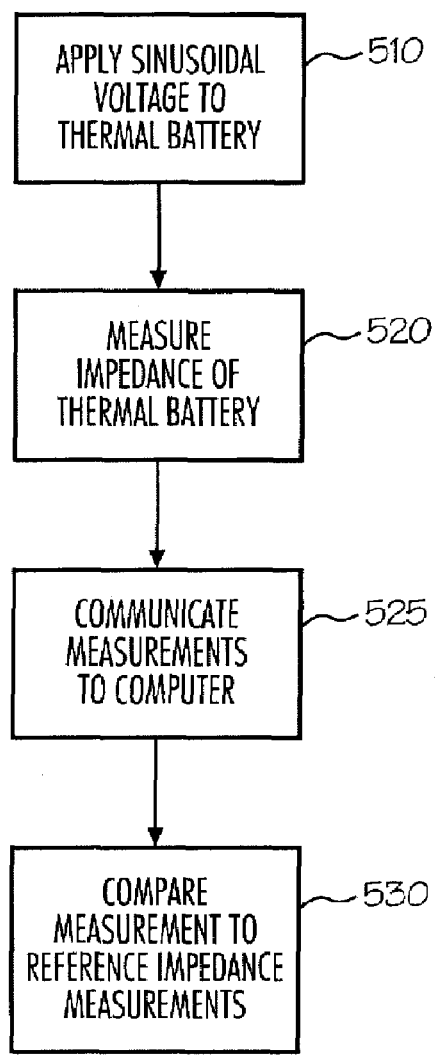
FIG. 5 illustrates an exemplary method of testing a thermal battery.

A first order model for a thermal battery may contain resistive and capacitive elements connected in series. For example, with reference to FIG. 3, a thermal battery model 310 comprises a resistive element $R_B$ and a capacitive element $C_B$ connected in series. The resistive element $R_B$ may represent, for example, all electrical resistance internal to the thermal battery, including, for example, electrical connections, spot welds to the header, and internal conductors associated with the thermal battery. The resistive element $R_B$ may also represent any external resistances, including that of the wiring harnesses and the like. In accordance with various exemplary embodiments, the connection across two terminals of thermal battery 200 does not necessarily include every section or cell within the thermal battery. For example, when thermal battery 100 is a 12 Volt battery, the connection across terminals 250 and 252 may provide a 12 Volt potential when activated; however, the connection across terminals 250 and 251 may only yield 6 Volts if it includes only half of sections 110 in thermal battery 100. Thus, resistive element $R_B$ may represent a subset of all the electrical resistances internal to the thermal battery. Stated differently, resistive element $R_B$ may represent all of the electrical resistances relevant to selected terminals of the thermal battery.

Similarly, capacitive element $C_B$ may represent all of the electrical capacitance that is associated with the relevant selected terminals of the thermal battery. These electrical capacitances may arise, for example, due to the cell stacks internal to the unit, spot welds to the header, and internal conductors associated with the thermal battery, as well as any external capacitances, including wiring harnesses and the like. This capacitance may, for example, be on the order of from about 10-200 pF; however, other magnitudes of capacitances may exist depending on the thermal battery. Thus, a first order thermal battery model 310 may be represented by an impedance $Z_B$ in an exemplary impedance test circuit 300, where $Z_B$ has a resistive component $R_B$ and a capacitive reactance component $XC_B$ such that (in rectangular form) $Z_B = R_B - jXC_B$. Although described herein in rectangular form, impedance may also be represented in polar form, where $Z_B$ is represented by a magnitude Z with a phase angle $\theta$. Regardless of the form of representation, it should be understood that impedance has a resistance component and a reactance component. In accordance with exemplary embodiments of the present invention, and as explained below, when the reactance component varies from that of "in family" batteries, the battery may be identified as an "out of family" battery.

In accordance with an exemplary embodiment of the present invention, a thermal battery testing apparatus (represented by model 300) comprises a sense resistance R and a sinusoidal voltage source $V_{in}$, having a frequency f. Resistance R and sinusoidal voltage source $V_{in}$ may be connected in series with thermal battery (represented by model 310). Thus, the total impedance of the circuit may be described as:

$$Z_T(f) = \{R + Z_B(f)\} = \{R + R_B - jXC_B(f)\}.$$

It has been found that the total impedance, and in particular, the $XC_B$ component, will be significantly different (higher or lower) for an "out of family" thermal battery as compared to an "in family" thermal battery. For example, the impedance of an "out of family" thermal battery may be a factor of from about 2 to about 10 times the impedance of an "in family" impedance. However, impedance differences of other magnitudes may also indicate the "in family"/"out of family" status of a thermal battery. In accordance with one aspect of an exemplary embodiment of the present invention, statistical analysis is used to determine whether a thermal battery is "in family" or "out of family." For example, an acceptable standard deviation that contains "in family" thermal batteries may depend on the number of samples (good and bad) that are used to generate the 'reference' value. In one exemplary embodiment, sixty known "in family" batteries and three known "out of family" batteries were tested to generate the 'reference' value and a three sigma standard deviation was used to determine whether a thermal battery was "in family" or "out of family."

In accordance with one aspect of an exemplary embodiment the present invention, an "out of family" thermal battery may have an additional capacitive element $C_X$ as part of the thermal battery model. The additional capacitive element may represent any out of specification or non-standard condition. For example, the additional capacitive element $C_X$ may represent a below standard header weld, an out-of-specification wafer alignment, a substandard wiring cable, and/or the like. The additional capacitive element $C_X$ may, for example, be added in series to the capacitance of the thermal battery $C_B$. However, in some instances, $C_X$ may be alternatively and/or additionally added in parallel to the capacitance of the thermal battery $C_B$. For example, a short near the header or in a wiring harness may place some components in parallel with the capacitance of the thermal battery.

Thus, the addition of $C_X$ in series causes the total capacitance $C_{total}$ of the thermal battery to decrease: $1/C_{total} = 1/C_X + 1/C_B$. Because the reactive term $XC_B$ is inversely proportional to $f \cdot C_B$, a lower $C_B$ may result in a significant increase in the reactance $XC_B$ and/or in the total impedance $Z_T(f)$ when compared to an "in family" total circuit impedance. Thus, where the additional capacitance $C_X$ is added in series, "out of family" batteries may have an increase in impedance, an increase in reactance, and/or a decrease in the total capacitance of the thermal battery. However, where the additional capacitance $C_X$ is added in parallel, "out of family" batteries may have a decrease in impedance, a decrease in reactance, and/or an increase in the total capacitance of the thermal battery. Therefore, in general, the impedance, reactance and/or capacitance of an "out of family" thermal battery may be higher or lower than those of known "in family" thermal batteries.

Thus, because an "out of family" thermal battery is likely to have a different impedance, reactance, and/or capacitance than an "in family" thermal battery, an "out of family" thermal battery may be identified by comparing impedance, reactance, and/or capacitance measurements of tested thermal batteries to a corresponding reference value that represents the impedance, reactance, and/or capacitance of "in family" and/or "out of family" batteries. If the impedance, reactance, and/or capacitance of a tested thermal battery is above an upper limit, below a lower limit, outside an acceptable range, greater than a specified magnitude from a pre-determined value, and/or the like, the tested thermal battery may be deemed "out of family."

Furthermore, the impedance, reactance and/or capacitance may be measured at various frequencies. However, at high frequencies, the term $XC_B$, which is $$\frac{1}{2 \cdot \pi \cdot f \cdot C_B}$$

becomes insignificant compared to the other terms. It may therefore be advantageous to test the thermal battery at lower frequencies, for example, where the $XC_B$ term is dominant when compared to the other terms. In one exemplary embodiment, the initial frequency value may be selected such that f is approximately equal to $$\frac{1}{2 \cdot \pi \cdot (R + R_B) \cdot C_B}$$

The frequency can then be adjusted upward or downward to provide a stable impedance, reactance and/or capacitance value. In other exemplary embodiments, frequencies in the range of 100 kHz to 5 kHz may be used. Furthermore, other suitable testing frequencies may also be used depending on the size, configuration and type of thermal battery.

In addition, the testing apparatus of the present invention may be configured to identify the condition that led to a battery being classified as "out of family." For example, certain 'out of specification' conditions may have a greater impact on the impedance, reactance, and/or capacitance measurements at one frequency than another. Thus, by testing a thermal battery at multiple frequencies, it may be found that the impedance, reactance, and/or capacitance measurements are more affected at particular frequencies, and/or that some changes in impedance, reactance, and/or capacitance at particular frequencies may be indicative of particular 'out of specification' conditions. For example, an 'out of specification' header weld may be indicated by "out of family" impedance, reactance, and/or capacitance measurements that are more pronounced at one frequency, while an 'out of specification' pill alignment may be indicated by "out of family" impedance, reactance and/or capacitance measurements that are more pronounced at a different frequency. In other embodiments, a single frequency may be sufficient for testing a thermal battery.

Thus, in accordance with an exemplary embodiment, the impedance, reactance, and/or capacitance testing apparatus of the present invention is generally configured to evaluate a thermal battery based on the deviation of a measured impedance, reactance, and/or capacitance value from an expected impedance, reactance, and/or capacitance value.

In accordance with one exemplary embodiment, the impedance, reactance, and/or capacitance of a thermal battery may be measured with reference to the series sense resistive element R. The voltage difference across resistance R may be measured as $V_R$. $V_R$ is directly proportional to the current $I_{in}$ through the thermal battery. In other words, $V_R = R \cdot I_{in}$, or $1/I_{in} = R/V_R$. Thus, the total impedance of impedance test circuit 300 may be further defined as: $Z_T(f) = \{R + Z_B(f)\} = V_{in}/I_{in} = \{R\}\{V_{in}\}/\{V_R\}$. In other words, the voltage $V_R$, the resistance R, the input voltage $V_{in}$, and the frequency f may be measured and the impedance, reactance, and/or capacitance calculated. For example, an oscilloscope or a digital voltmeter may be used to make these measurements. At lower frequencies, the total capacitance may be estimated by $$Ctotal = \frac{V_R}{2 \cdot \pi \cdot f \cdot R \cdot V_{in}}$$

In another exemplary embodiment, the element R may be eliminated from the thermal battery testing apparatus. For example, an LCR meter may be used to measure the impedance, reactance, and/or capacitance and the phase angle of the thermal battery. In yet another embodiment, a current probe, oscilloscope, and signal generator may be used to determine the current through the thermal battery and the voltage across the thermal battery and then calculate the impedance, reactance and/or capacitance and phase angle. In another exemplary embodiment, a square wave pulse may be applied to the thermal battery, the time response may be measured using an oscilloscope, and the measured time response may be used to calculate the capacitance of a thermal battery. Furthermore, other methods may be used to measure, approximate, and/or calculate the impedance, reactance and/or capacitance of the thermal battery.

Therefore, in accordance with various exemplary embodiments of the present invention, impedance, reactance, and/or capacitance may be measured/calculated in various ways to determine whether a particular thermal battery is "in family" or "out of family." The impedance, reactance and/or capacitance of the thermal battery may be measured at one or more frequencies. For any given frequency, "in family" batteries may have impedances/capacitances similar to one another, and an impedance, reactance, and/or capacitance that is significantly different from the "in family" battery impedance, reactance, and/or capacitance may indicate an "out of family" battery. In particular, for "in series" type cases, the impedance in "out of family" batteries may be higher than that of "in family" batteries and the capacitance of "out of family" batteries may be lower than that of "in family" batteries. In addition, for "in parallel" type cases, the impedance in "out of family" batteries may be lower than that of "in family" batteries and the capacitance of "out of family" batteries may be higher than that of "in family" batteries.

In accordance with an exemplary embodiment of the present invention, a thermal battery testing system 400 comprises a testing device 410 and a computer 420. The testing device 410, may, for example, be an Omni Tester, Model 2501. However the Testing, testing device 410 may be a LCR meter, such as a HP 4262A, and/or like devices that are configured to directly perform impedance measurements between two or more terminals.

Testing device 410 may, for example, comprise a function generator or similar device. For example, the function generator may comprise a Hewlett Packard model 3325A function generator and/or the like. Testing device 410 may also comprise one or more multimeters. For example, the multimeters may be digital multimeters and comprise a Keithley model 617 or equivalent, and/or an LCR meter, such as a HP 4262A meter, and/or the like. Although described herein as digital meters, the meters may also be analog. In accordance with one aspect of an exemplary embodiment, the multimeters have a bandwidth greater than or equal to 300 KHz. Thus, testing device 410 may include any combination of components that are configured to measure impedance, reactance, and/or capacitance.

Testing device 410 may further be configured with one or more test connectors 411 for electrically connecting testing device 410 to a thermal battery 401 to be tested. The connectors may be electrically connected to two or more terminals of the thermal battery.

Two or more connectors may comprise an "impedance test fixture," otherwise known as a "thermal battery test fixture." In one exemplary embodiment, the electrical contacts are arranged in a spring loaded test fixture that is configured to quickly make safe, continuous, repeatable connections to the thermal battery. The test fixture may be configured to facilitate connection of test equipment to the thermal battery. The thermal battery may be locked into position to maintain the electrical contacts.

In accordance with one exemplary embodiment, testing device 410 may configured to measure the impedance, reactance, and/or capacitance across two terminals. In accordance with another exemplary embodiment, testing device 410 may be configured to measure the impedance, reactance, and/or capacitance across multiple combinations of terminals in sequence, in an automated manner as controlled by a computer, and/or without changing connections. For example, connectors 411 may be configured to be attached to each terminal, and the testing device may be configured to test various combinations of terminals separately from one another.

Testing device 410 may be further configured to communicate with computer 420. For example, testing device 410 may communicate the measured impedance(s), reactance(s), and/or capacitance(s) to computer 420. Computer 420 may be configured to receive battery identification information, receive parameters, receive measurement data, process data, determine whether a thermal battery is "in family" or "out of family," report and/or store data. In this regard, the computer may be configured to develop and/or use pass/fail criteria established from a statistical sample. In accordance with an exemplary embodiment, the impedance, reactance and/or capacitance of a "out of family" thermal battery may be higher or lower than those of known "in family" thermal batteries; therefore, the computer may be configured to identify whether measurement data falls within an acceptable range of impedance, reactance, and/or capacitance measurements.

The systems and/or components of the systems discussed herein also may include one or more host servers or other computing systems including a processor suitably configured to process digital data, a memory coupled to the processor for storing digital data, an input digitizer coupled to the processor for inputting digital data, an application program stored in the memory and accessible by the processor for directing processing of digital data by the processor, a display coupled to the processor and memory for displaying information derived from digital data processed by the processor and a plurality of databases, the databases including measurement data, comparison data, parameter data, thermal battery identification data and/or like data that could be used in association with the present invention. As those skilled in the art may appreciate, a computer may also include an operating system (e.g., Windows NT, 95/98/2000, Linux, Solaris, etc.) as well as various conventional support software and drivers typically associated with computers.

In one exemplary embodiment, testing system 400 is suitably configured with hardware and/or software, such as a desktop computer. As another example, testing system 400 may comprise a computing center such as a mainframe computer. However, the computing center of the testing system 400 may be implemented in other forms, such as a personal computer, a mini-computer, a PC server, a network set of computers, or the like.

The thermal batteries may be identified via a thermal battery identifier, such as, a serial number. Nevertheless, it should be appreciated that the identifier may be any number or other indicia. The identifier may include any indicia such as, for example, a number, letter, symbol, signal and/or the like. The identifier may identify any one or more of lots, specific battery characteristics, and/or the like. The account identifier may be distributed and stored in any form of plastic, electronic, magnetic, radio frequency, audio, and/or optical device capable of being read, or transmitting or downloading data from itself to a second device.

In accordance with one aspect of an exemplary embodiment, the thermal battery identifier includes at least a portion of a machine readable code, such as a bar code. In another example, the thermal battery identifier may be stored in a magnetic stripe encoded format. In another exemplary embodiment, the thermal battery identifier may be entered into an electronic system manually or by other means (bar code, machine readable code, etc.). In yet another exemplary embodiment, the computer may be suitably configured to determine the type and/or identity of a tested thermal battery. For example, the computer may be configured to scan a bar code, read a magnetic stripe on a card, and/or receive manual input to identify the thermal battery.

Furthermore, the various processes may include a user facilitating the input of information related to the thermal battery into a computer system. The information may be inputted into a computer via keypad, magnetic stripe, smart card, electronic pointer, touch pad, and/or the like. The information may be transmitted via any network. In another example, an internet web page based system may be suitably configured with fields for manual or automatic entry of a thermal battery identifier, and/or other information related to the thermal battery. Thus, information characterizing thermal batteries (size, specifications, model number, and/or the like) may be stored for later comparison with batteries of the same type. Furthermore, identifying the battery may facilitate determining the type of that battery.

The testing system 400 also may include a computer that may be suitably configured to provide a suitable website or other Internet-based graphical user interface that is accessible by users who are using the testing device or who are accessing the test results. The terms "web page" or "web site" as they are used herein are not meant to limit the type of documents and applications that might be used to interact with the user. For example, a typical website might include, in addition to standard HTML documents, various forms, Java applets, JavaScript, active server pages (ASP), common gateway interface scripts (CGI), extensible markup language (XML), dynamic HTML, cascading style sheets (CSS), helper applications, plug-ins, and/or the like.

One skilled in the art may appreciate that a network may include any system for exchanging data, such as the Internet, an intranet, an extranet, WAN, LAN, satellite communications, and/or the like. It is noted that the network may be implemented as other types of networks. The users may interact with the system via any input device such as a keyboard, mouse, kiosk, personal digital assistant, handheld computer (e.g., Palm Pilot®), cellular phone, and/or the like. Similarly, the invention could be used in conjunction with any type of personal computer, network computer, workstation, minicomputer, mainframe, or the like running any operating system such as any version of Windows, Windows NT, Windows2000, Windows 98, Windows 95, MacOS, OS/2, BeOS, Linux, UNIX, Solaris or the like. Moreover, although the invention may be described herein as being implemented with TCP/IP communications protocols, it may be readily understood that the invention could also be implemented using IPX, Appletalk, IP-6, NetBIOS, OSI or any number of existing or future protocols. Moreover, the system may contemplate the communication of information over any network having similar functionality described herein.

In accordance with various aspects of the present invention, an impedance test method facilitates identification of "in family" versus "out of family" thermal batteries. An "in family" thermal battery is one that has similar impedance characteristics with batteries that are known to have no defects. An "out of family" thermal battery is one where the impedance characteristics deviate from "in family" impedance characteristics. For example, an "out of family" thermal battery may have a poor weld connection within the thermal battery. The "in family" versus "out of family" status of a thermal battery may similarly be determined by a reactance test method or a capacitance test method.

In accordance with an exemplary embodiment of the present invention, the thermal battery test method 500 comprises the steps of: (i) applying a sinusoidal voltage to a thermal battery (step 510), (ii) measuring the impedance (step 520), and (iii) comparing the measurement to a reference impedance (i.e., a 'standard' representing, for example, an acceptable impedance) to determine whether the thermal battery is "in family" or "out of family" (step 530).

In accordance with another exemplary embodiment, the thermal battery test method includes the step of creating a reference measurement and/or standard. The reference values may be established by testing known thermal batteries in control groups. In one exemplary embodiment, a control group of "known good" batteries of the same type are tested and the results recorded. A control group of "known 'out of specification'" units of the same type as the "known good" batteries are also tested and the results recorded. These tests may be run multiple times, at different times of the day, at different temperatures and humidity levels, and in different orders to validate consistency. The tests may be performed at one or more frequencies in the range of from about 5-100 kHz. Furthermore, the steps may be repeated for various frequency levels. In some embodiments, the test may be run at specific frequencies that evaluate different parts of the thermal battery. The results may be averaged, or subsets thereof may be averaged, to prepare "in family" comparison(s) for batteries of that type. Furthermore, individual results may be stored, or subsets of the testing may be averaged and stored in connection with relevant parameters.

In one exemplary embodiment, the R value, $V_{in}$, the frequency and $V_R$ are measured and recorded. Some of this information may be measured, for example, using an oscilloscope. This information is then used to calculate the impedance, reactance, and/or capacitance of the thermal battery. In another exemplary embodiment, current is sensed using a current probe and the phase shift and frequency are measured to calculate the impedance, reactance and/or capacitance. In yet another embodiment the impedance, reactance, and/or capacitance is measured using an LCR meter.

"In family" impedance, reactance, and/or capacitance measurements may depend upon a variety of parameters such as the number of cell components in the thermal battery, number of sections, number of taps, the materials used to make the thermal battery, the ambient temperature, the type of battery, the battery model, and/or the like. The reference measurements or standards may be associated with one or more of these parameters. Then, during testing of a thermal battery, in one exemplary embodiment, the system may use one or more of the parameters to facilitate comparison of the appropriate reference measurement or standard to the measured value(s) for that thermal battery. For example, the thermal battery that is being tested may be scanned to obtain the thermal battery identifier, and based on the thermal battery identifier, the parameters for that battery may be looked up in a database. In another example, one or more of the parameters associated with the particular battery being tested may be input to computer 420 at the time of the testing.

The parameters may be received by computer 420 via manual input or through automated methods such as scanning. The parameters may also be received from a database or other storage device from which the parameters are "looked up" by the computer. Also, the parameters may be calculated from other input and/or extrapolated based on other parameters.

In one exemplary embodiment, the measurements are communicated to computer 420 (step 525). Computer 420 is configured to perform the steps of storing, communicating, and/or processing the measurements from testing device 410. The processing step may further include the steps of receiving input relative to the parameters of the battery being tested, looking up (in a database or table) or calculating the relevant reference measurement or standard, comparing the measured results to relevant reference measurements or standards, and/or determining and reporting "in family" and/or "out of family" status for each measured battery.

Such reporting may be performed, for example, via audio, and/or visual display. Reporting may be performed on a battery by battery basis, such as by sounding an alarm upon detection of an "out of family" battery. Reporting also may be performed in batches, such as by creating a summary report for a batch where individual thermal batteries are identified by lot number and/or serial number, and the "in family" or "out of family" status is reported for each. Reports may further identify which section and/or component of the thermal battery gave rise to the "out of family" status.

The measuring of the impedance, reactance, and/or capacitance of the thermal battery (step 520) may be performed in the factory during the assembly process, upon completion of the thermal battery, and/or in the field to verify quality control after shipping/storage of the thermal battery and/or attached wiring harnesses. Furthermore, the measuring step may include automatically measuring multiple sections of the thermal battery, in sequence, and reporting the battery status based on all, or a subset of, the sections. Impedance measurements may be represented in rectangular or polar form, or in any manner that facilitates comparison of the measured reactance to a standard reactance for that type of battery.

In accordance with one aspect of the present invention, the thermal battery testing method facilitates a reduction in destructive testing and an increase in the output of saleable thermal batteries. For example, Lot Acceptance Testing (LAT) is a common practice for destructively testing a certain number of thermal batteries in each lot of thermal batteries. By way of example, and recognizing that the numbers vary with battery types, X out of every 1000 batteries in a lot may be destructively tested. These LAT tests may be used to qualify the batteries. However, standards such as Mill standard 105, may allow for the reduction of the number of destructively tested thermal batteries if the destructive testing does not find any, or few thermal batteries with faults. For example, after 10 tests with none, or few, "out of family" batteries, the number of LAT tests may be reduced to X−Y out of 1000 batteries in a lot (assuming Y is a positive integer smaller than integer X).

Thus, by identifying "out of family" batteries before the destructive testing, a smaller number of batteries may be lost due to the qualification testing process, and throughput may be increased. Stated differently, the thermal battery testing method of the present invention facilitates an improved track record and thus facilitates use of a lower number of destructive tests.

Furthermore, the testing method facilitates a reduction in the time to test batteries. Also, the overall time to make thermal batteries may be improved. In addition, the accuracy of testing thermal batteries may be improved. For example, thermal battery testing according to the present invention may be less likely to produce a false positive, that is, "out of family" result. Moreover, thermal battery test method 500 may be performed on thermal batteries during production, in the factory, in the field, and/or after installation into the next assembly.

The present invention may be described herein in terms of functional block components, optional selections and/or various processing steps. It should be appreciated that such functional blocks may be realized by any number of hardware and/or software components suitably configured to perform the specified functions. For example, the present invention may employ various integrated circuit components, e.g., memory elements, processing elements, logic elements, look-up tables, and/or the like, which may carry out a variety of functions under the control of one or more microprocessors or other control devices. Similarly, the software elements of the present invention may be implemented with any programming or scripting language such as C, C++, Java, COBOL, assembler, PERL, Visual Basic, SQL Stored Procedures, extensible markup language (XML), with the various algorithms being implemented with any combination of data structures, objects, processes, routines or other programming elements. Further, it should be noted that the present invention may employ any number of conventional techniques for data transmission, messaging, data processing, network control, and/or the like.

It should be appreciated that the particular implementations shown and described herein are illustrative of the invention and its best mode and are not intended to otherwise limit the scope of the present invention in any way. Indeed, for the sake of brevity, conventional data networking, application development and other functional aspects of the systems (and components of the individual operating components of the systems) may not be described in detail herein. It should be noted that many alternative or additional functional relationships or physical connections might be present in a practical thermal battery testing system.

As may be appreciated by one of ordinary skill in the art, the present invention may be embodied as a method, a testing system, a device for testing thermal batteries, and/or a computer program product. Accordingly, the present invention may take the form of an entirely software embodiment, an entirely hardware embodiment, or an embodiment combining aspects of both software and hardware or other physical devices. Furthermore, the present invention may take the form of a computer program product on a computer-readable storage medium having computer-readable program code means embodied in the storage medium. Any suitable computer-readable storage medium may be utilized, including hard disks, CD-ROM, optical storage devices, magnetic storage devices, and/or the like.

In the foregoing specification, the invention has been described with reference to specific embodiments. However, it may be appreciated that various modifications and changes may be made without departing from the scope of the present invention. The specification and figures are to be regarded in an illustrative manner, rather than a restrictive one, and all such modifications are intended to be included within the scope of present invention. Accordingly, the scope of the invention should be determined by the appended claims and their legal equivalents, rather than by the examples given above. For example, the steps recited in any of the method or process claims may be executed in any order and are not limited to the order presented.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

What is claimed is:

1. A method for testing a thermal battery, comprising the steps of:

applying a sinusoidal voltage to the thermal battery, wherein the thermal battery comprises at least one cell, and wherein said at least one cell comprises a plurality of solid pellets, and wherein at least one of the plurality of solid pellets is a pyrotechnic heat source determining at least one of an impedance, a reactance, and a capacitance across two terminals of the thermal battery;

comparing said at least one of said impedance, said reactance, and said capacitance to at least one of a reference impedance, a reference reactance, and a reference capacitance; and, indicating whether the thermal battery is "in family" or "out of family."

2. The method of claim 1, wherein said method facilitates a reduction in the number of batteries that are destructively tested.

3. The method of claim 1, wherein said indicating step identifies at least one of:

out of specification thermal batteries, sub-standard thermal batteries, and specific thermal battery components that are out of specification.

4. The method of claim 1, further comprising the steps of:

connecting the thermal battery in series with a resistance;

connecting the thermal battery and resistance in series with a sinusoidal voltage source.

5. The method of claim 1, wherein the thermal battery is associated with one or more parameters, and wherein said at least one of reference impedance, reference reactance and reference capacitance is associated with similar parameters.

6. The method of claim 1, wherein said method is performed in the field.

7. The method of claim 1, further comprising the steps of measuring at least one of said impedance, said reactance, and said capacitance of a control group of thermal batteries, and storing the measurements from said control group, and wherein at least one of said reference impedance, said reference reactance, and said reference capacitance is based on said stored measurements from said control group.

8. The method of claim 1, further comprising the step of identifying the cause of an "out of family" status of the thermal battery based on at least one of said impedance, reactance, and capacitance measurements.

9. A system for testing a thermal battery comprising:

a testing device, wherein said testing device is configured to determine at least one of an impedance, a reactance, and a capacitance across two terminals of the thermal battery based in part on applying a sinusoidal voltage; and a computer, wherein said computer is configured to communicate with said testing device, wherein said computer is configured to receive at least one of said determined impedance, reactance, and capacitance from said testing device, and wherein said computer is configured to compare at least one of said determined impedance, reactance, and capacitance to a standard;

wherein the thermal battery comprises at least one cell, and wherein said at least one cell comprises a plurality of solid pellets, and wherein at least one of the plurality of solid pellets is a pyrotechnic heat source; and wherein said computer is configured to identify thermal batteries that differ from said standard.

10. The system of claim 9, wherein said computer is further configured to receive an identifier of the thermal battery and to select, based on said identifier, a standard that is associated with the thermal battery.

11. The system of claim 9, wherein said testing device further comprises:

a multimeter that is configured to measure the voltage across a resistive element; and a LCR meter that is configured to measure the impedance of the thermal battery.

12. The system of claim 9, further comprising a database, wherein said database comprises at least one of "in family" standards and "out of family" standards for comparison to at least one of said determined impedance, reactance, and capacitance.

13. The system of claim 12, wherein said standards are associated with a set of parameters.

14. The system of claim 13, wherein said set of parameters comprise at least one of: the number of cell components in the thermal battery, number of sections, number of taps, the materials used to make the thermal battery, and ambient temperature.

15. A thermal battery testing apparatus comprising:

a testing device, having a connection wire configured for connecting said testing device to two or more terminals of the thermal battery, wherein said testing device is configured to measure at least one of an impedance, a reactance, and a capacitance across at least two of said two or more terminals based in part on applying a sinusoidal voltage to the thermal battery, and wherein said testing device is configured to indicate the quality of the thermal battery based on at least one of said measured impedance, reactance, and capacitance; wherein the thermal battery comprises at least one cell, and wherein said at least one cell comprises a plurality of solid pellets, and wherein at least one of the plurality of solid pellets is a pyrotechnic heat source.

16. The testing apparatus of claim 15, wherein said testing device is configured to communicate with a computer, and wherein said indicating occurs through said computer, wherein said computer is configured to receive at least one of said impedance, said reactance, and said capacitance measurements from said testing device, and wherein said computer is configured to compare said measured at least one of said impedance, said reactance, and said capacitance to a standard; and, wherein said computer is configured to identify thermal batteries that differ from said standard.

17. The testing apparatus of claim 15, wherein said computer is further configured to receive the identity of the thermal battery and to use a standard associated with that identity.

18. The testing apparatus of claim 15, wherein said testing device further comprises:

a multimeter that is configured to measure resistance; and a LCR meter that is configured to measure the impedance of the thermal battery.

19. The testing apparatus of claim 15, wherein said quality is determined based on comparison to a standard, and wherein said standard is selected from among more than one standard based on a set of parameters.

20. The testing apparatus of claim 19 wherein said parameters comprise at least one of: the number of cell components in the thermal battery, number of sections, number of taps, the materials used to make the thermal battery, and ambient temperature, and wherein said parameters are related to a type of thermal battery based on a thermal battery identifier.

21. The thermal battery testing apparatus of claim 15, wherein said testing device is configured to apply a square wave pulse to the thermal battery, to measure the time response, and to calculate the capacitance across two of said two or more terminals of the thermal battery based on said time response, and wherein said testing device is configured to indicate the quality of the thermal battery based on said measured capacitance.

22. A method for testing a thermal battery, comprising:

applying a sinusoidal voltage to the said thermal battery battery, wherein said thermal battery comprises at least one cell, and wherein said at least one cell comprises a plurality of solid pellets, and wherein at least one of the plurality of solid pellets is a pyrotechnic heat source;

determining at least one of an impedance, a reactance, and a capacitance across two terminals of said thermal battery;

comparing at least one of said impedance, said reactance, and said capacitance to at least one of a reference impedance, a reference reactance, and a reference capacitance.

23. The method of claim 22, wherein said thermal battery is in a non-active state.

24. The method of claim 23, wherein said thermal battery is tested in a nondestructive manner.

25. The method of claim 22, wherein said thermal battery is not ignited during said method for testing said thermal battery.

* * * * *

UNITED STATES PATENT AND TRADEMARK OFFICE
CERTIFICATE OF CORRECTION

PATENT NO. : 7,545,147 B2  Page 1 of 1
APPLICATION NO. : 11/162061
DATED : June 9, 2009
INVENTOR(S) : Hart et al.

It is certified that error appears in the above-identified patent and that said Letters Patent is hereby corrected as shown below:

In Col. 13, Line 17 Claim 4, before "connecting the thermal battery and resistance" insert therefore --and--.

In Col. 14, Line 65 Claim 22, delete "voltage to the said" and insert therefore --voltage to said--.

Signed and Sealed this

Ninth Day of February, 2010

David J. Kappos
*Director of the United States Patent and Trademark Office*